United States Patent
Hsu

(10) Patent No.: US 8,153,029 B2
(45) Date of Patent: Apr. 10, 2012

(54) LASER (230NM) ABLATABLE COMPOSITIONS OF ELECTRICALLY CONDUCTING POLYMERS MADE WITH A PERFLUOROPOLYMERIC ACID APPLICATIONS THEREOF

(75) Inventor: Che-Hsiung Hsu, Wilmington, DE (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 1003 days.

(21) Appl. No.: 11/960,820

(22) Filed: Dec. 20, 2007

(65) Prior Publication Data
US 2008/0213594 A1    Sep. 4, 2008

Related U.S. Application Data

(60) Provisional application No. 60/877,568, filed on Dec. 28, 2006.

(51) Int. Cl.
| H01B 1/00 | (2006.01) |
| C08G 75/00 | (2006.01) |
| C08G 73/00 | (2006.01) |
| C08G 73/06 | (2006.01) |
| H01L 29/08 | (2006.01) |

(52) U.S. Cl. ........ 252/500; 528/377; 528/422; 528/423; 257/40

(58) Field of Classification Search ....... 252/500–521.6; 528/373, 422, 423; 257/40
See application file for complete search history.

(56) References Cited

U.S. PATENT DOCUMENTS

| 3,282,875 A | 11/1966 | Connolly et al. |
| 4,321,114 A | 3/1982 | MacDiarmid et al. |
| 4,356,429 A | 10/1982 | Tang |
| 4,358,545 A | 11/1982 | Ezzell et al. |
| 4,433,082 A | 2/1984 | Grot |
| 4,539,507 A | 9/1985 | VanSlyke et al. |
| 4,552,927 A | 11/1985 | Warren |
| 4,711,742 A | 12/1987 | Jen et al. |
| 4,731,408 A | 3/1988 | Jasne |
| 4,738,757 A | 4/1988 | Naarmann |
| 4,869,979 A | 9/1989 | Ohtani et al. |
| 4,889,659 A | 12/1989 | Genies |
| 4,933,106 A | 6/1990 | Sakai et al. |
| 4,940,525 A | 7/1990 | Ezzell et al. |
| 4,959,430 A | 9/1990 | Jonas et al. |
| 4,973,391 A | 11/1990 | Madou et al. |
| 5,002,700 A | 3/1991 | Otagawa et al. |
| 5,035,926 A | 7/1991 | Jonas et al. |
| 5,247,190 A | 9/1993 | Friend et al. |
| 5,286,413 A | 2/1994 | Hannecart |

(Continued)

FOREIGN PATENT DOCUMENTS

CN    1274869 A    11/2000

(Continued)

OTHER PUBLICATIONS

Lee et al., Poly(thieno[3,4-b]thiophene). A New Stable Low Band Gap Conducting Polymer, Macromolecules, 2001, vol. 34:5746-5747.

(Continued)

*Primary Examiner* — Mark Kopec
*Assistant Examiner* — Jaison Thomas

(57) ABSTRACT

An aqueous composition including (a) a dispersion of at least one electrically conductive polymer doped with at least one highly-fluorinated acid polymer and (b) a second material which can be a second polymeric acid, an acid salt of the second polymeric acid, or a combination thereof.

17 Claims, 1 Drawing Sheet

U.S. PATENT DOCUMENTS

| | | | |
|---|---|---|---|
| 5,294,504 A | 3/1994 | Otagawa et al. |
| 5,300,575 A | 4/1994 | Jonas |
| 5,312,681 A | 5/1994 | Muys |
| 5,317,169 A | 5/1994 | Nakano et al. |
| 5,354,613 A | 10/1994 | Quintens et al. |
| 5,370,981 A | 12/1994 | Krafft et al. |
| 5,372,924 A | 12/1994 | Quintens et al. |
| 5,378,402 A | 1/1995 | Cross et al. |
| 5,408,109 A | 4/1995 | Heeger et al. |
| 5,463,005 A | 10/1995 | Desmarteau |
| 5,489,400 A | 2/1996 | Liu et al. |
| 5,567,356 A | 10/1996 | Kinlen |
| 5,578,249 A | 11/1996 | Ohtani et al. |
| 5,585,038 A | 12/1996 | Kirmanen et al. |
| 5,705,888 A | 1/1998 | Staring et al. |
| 5,716,550 A | 2/1998 | Gardner et al. |
| 5,766,515 A | 6/1998 | Jonas et al. |
| 5,798,170 A | 8/1998 | Zhang et al. |
| 5,863,465 A | 1/1999 | Kinlen |
| 5,910,385 A | 6/1999 | Gardner et al. |
| 5,917,279 A | 6/1999 | Elschner et al. |
| 5,986,400 A | 11/1999 | Staring et al. |
| 5,994,496 A | 11/1999 | Van Haare et al. |
| 6,004,483 A | 12/1999 | Jonas et al. |
| 6,083,635 A | 7/2000 | Jonas et al. |
| 6,132,644 A | 10/2000 | Angelopoulos et al. |
| 6,150,426 A | 11/2000 | Curtin |
| 6,157,113 A | 12/2000 | Hunter et al. |
| 6,197,418 B1 | 3/2001 | Cloots et al. |
| 6,225,040 B1 | 5/2001 | Muys et al. |
| 6,303,238 B1 | 10/2001 | Thompson et al. |
| 6,303,943 B1 | 10/2001 | Yu et al. |
| 6,340,496 B1 | 1/2002 | Cloots et al. |
| 6,358,437 B1 | 3/2002 | Jonas |
| 6,376,105 B1 | 4/2002 | Jonas et al. |
| 6,391,481 B1 | 5/2002 | Jonas et al. |
| 6,452,711 B1 | 9/2002 | Heuer |
| 6,515,314 B1 | 2/2003 | Duggal et al. |
| 6,611,096 B1 | 8/2003 | McCormick et al. |
| 6,670,645 B2 | 12/2003 | Grushin et al. |
| 6,685,853 B1 | 2/2004 | Angelopoulos et al. |
| 6,756,474 B2 | 6/2004 | Hsu |
| 6,759,441 B1 | 7/2004 | Kerres et al. |
| 6,806,349 B2 | 10/2004 | Angelopoulos et al. |
| 6,913,944 B2 | 7/2005 | Hirai |
| 7,053,174 B2 | 5/2006 | Kirchmeyer et al. |
| 7,056,600 B2 | 6/2006 | Andriessen |
| 7,166,010 B2 | 1/2007 | Lamansky et al. |
| 7,189,991 B2 | 3/2007 | Yu et al. |
| 7,317,047 B2 | 1/2008 | Hsu |
| 7,338,620 B2 | 3/2008 | Hsu et al. |
| 7,351,358 B2 | 4/2008 | Hsu et al. |
| 7,371,336 B2 * | 5/2008 | Hsu et al. ............... 252/301.35 |
| 7,390,438 B2 | 6/2008 | Hsu et al. |
| 7,431,866 B2 | 10/2008 | Hsu et al. |
| 7,455,793 B2 | 11/2008 | Hsu et al. |
| 7,462,298 B2 * | 12/2008 | Hsu et al. ............... 252/301.35 |
| 7,563,392 B1 | 7/2009 | Hsu et al. |
| 2001/0016303 A1 | 8/2001 | Majumdar et al. |
| 2001/0019782 A1 | 9/2001 | Igarashi et al. |
| 2001/0022497 A1 | 9/2001 | Aoki et al. |
| 2002/0009680 A1 | 1/2002 | Majumdar et al. |
| 2002/0038999 A1 | 4/2002 | Cao |
| 2002/0041151 A1 | 4/2002 | Park |
| 2002/0098377 A1 | 7/2002 | Cao et al. |
| 2002/0099119 A1 | 7/2002 | Craig et al. |
| 2002/0127381 A1 | 9/2002 | Will et al. |
| 2002/0136923 A1 | 9/2002 | Jonas et al. |
| 2002/0179900 A1 | 12/2002 | Buechel et al. |
| 2003/0062510 A1 | 4/2003 | Van den Bogaert |
| 2004/0010115 A1 | 1/2004 | Sotzing |
| 2004/0072987 A1 | 4/2004 | Groenendaal et al. |
| 2004/0092700 A1 | 5/2004 | Hsu |
| 2004/0102577 A1 | 5/2004 | Hsu et al. |
| 2004/0124504 A1 | 7/2004 | Hsu |
| 2004/0127637 A1 | 7/2004 | Hsu et al. |
| 2004/0164939 A1 | 8/2004 | Johnson et al. |
| 2004/0181011 A1 | 9/2004 | Korzhenko et al. |
| 2004/0206942 A1 * | 10/2004 | Hsu ............................. 252/500 |
| 2004/0222413 A1 | 11/2004 | Hsu et al. |
| 2004/0254297 A1 | 12/2004 | Hsu et al. |
| 2004/0262599 A1 | 12/2004 | Bernds |
| 2005/0049319 A1 | 3/2005 | Stone et al. |
| 2005/0175861 A1 | 8/2005 | Elschner et al. |
| 2005/0202274 A1 | 9/2005 | Elschner et al. |
| 2005/0205860 A1 | 9/2005 | Hsu et al. |
| 2005/0208328 A1 | 9/2005 | Hsu et al. |
| 2005/0222333 A1 | 10/2005 | Hsu |
| 2005/0224765 A1 | 10/2005 | Hsu et al. |
| 2006/0076557 A1 | 4/2006 | Waller et al. |
| 2006/0138401 A1 | 6/2006 | Yu et al. |
| 2006/0261314 A1 | 11/2006 | Lang et al. |
| 2006/0289843 A1 | 12/2006 | Hsu et al. |
| 2007/0045591 A1 * | 3/2007 | Hsu et al. ..................... 252/500 |
| 2007/0069185 A1 | 3/2007 | Hsu et al. |
| 2007/0172702 A1 * | 7/2007 | Elschner et al. ............ 428/690 |
| 2008/0128662 A1 | 6/2008 | Hsu et al. |
| 2008/0135809 A1 * | 6/2008 | Hsu ............................. 252/500 |
| 2008/0193773 A1 | 8/2008 | Hsu et al. |
| 2008/0210910 A1 | 9/2008 | Hsu et al. |
| 2008/0283800 A1 * | 11/2008 | Hsu ............................. 252/511 |
| 2009/0318710 A1 | 12/2009 | Brassat et al. |
| 2010/0247923 A1 * | 9/2010 | Hsu ............................. 428/419 |

FOREIGN PATENT DOCUMENTS

| | | |
|---|---|---|
| CN | 1276388 A | 12/2000 |
| DE | 2029556 A1 | 12/1971 |
| DE | 3938094 A1 | 5/1991 |
| DE | 4211459 A1 | 7/1993 |
| DE | 4334390 C2 | 4/1995 |
| EP | 0488321 A1 | 6/1992 |
| EP | 0560721 A2 | 9/1993 |
| EP | 269090 A1 | 2/1994 |
| EP | 0593111 B1 | 4/1994 |
| EP | 0440957 A2 | 3/1996 |
| EP | 0962943 A1 | 12/1999 |
| EP | 1054414 A1 | 11/2000 |
| EP | 1079397 A1 | 2/2001 |
| EP | 1227529 B1 | 7/2002 |
| EP | 1231251 A1 | 8/2002 |
| EP | 1061530 B1 | 3/2003 |
| EP | 1384739 A1 | 1/2004 |
| EP | 1564251 * | 8/2005 |
| EP | 1564251 A1 | 8/2005 |
| EP | 1026152 B1 | 7/2006 |
| EP | 1810986 * | 7/2007 |
| EP | 1810986 A2 | 7/2007 |
| EP | 1191614 B1 | 6/2009 |
| EP | 1191612 B1 | 9/2009 |
| FR | 2632979 A1 | 12/1989 |
| GB | 2124635 A | 2/1984 |
| JP | 62138582 A | 6/1987 |
| JP | 62164717 A | 7/1987 |
| JP | 63135453 A | 6/1988 |
| JP | 63215772 A | 9/1988 |
| JP | 02160823 A | 6/1990 |
| JP | 02209931 A | 8/1990 |
| JP | 04234453 A | 8/1992 |
| JP | 05255576 A | 10/1993 |
| JP | 05262981 A | 10/1993 |
| JP | 06264024 A | 9/1994 |
| JP | 06306280 A | 11/1994 |
| JP | 06313038 A | 11/1994 |
| JP | 07010973 A | 1/1995 |
| JP | 07090060 A | 4/1995 |
| JP | 07165892 A | 6/1995 |
| JP | 08048858 A | 2/1996 |
| JP | 09176310 A | 7/1997 |
| JP | 10261418 A | 9/1998 |
| JP | 10509751 A | 9/1998 |
| JP | 11353934 A | 12/1999 |
| JP | 2000091081 A | 3/2000 |
| JP | 2000505249 A | 4/2000 |
| JP | 2000336154 A | 12/2000 |
| JP | 2001035276 A | 2/2001 |
| JP | 2001270999 A | 10/2001 |
| JP | 2001325831 A | 11/2001 |

| | | | |
|---|---|---|---|
| JP | 2002500408 A | 1/2002 | |
| JP | 2002246177 A | 8/2002 | |
| JP | 2003261749 A | 9/2003 | |
| JP | 2003297582 A | 10/2003 | |
| JP | 2003301116 A | 10/2003 | |
| JP | 2004502004 A | 1/2004 | |
| JP | 2004107552 A | 4/2004 | |
| JP | 2004231939 A | 8/2004 | |
| JP | 2004532307 A | 10/2004 | |
| JP | 2005108504 A | 4/2005 | |
| JP | 2005120363 A | 5/2005 | |
| JP | 2005536595 A | 12/2005 | |
| JP | 2006500461 A | 1/2006 | |
| JP | 2006500463 A | 1/2006 | |
| JP | 2006502254 A | 1/2006 | |
| JP | 2009270117 A | 11/2009 | |
| RU | 2035803 C1 | 5/1995 | |
| WO | 9614343 A1 | 5/1996 | |
| WO | 99/34371 A1 | 7/1999 | |
| WO | WO 00/70655 A2 | 11/2000 | |
| WO | 01/38219 A1 | 5/2001 | |
| WO | WO 01/41512 A1 | 6/2001 | |
| WO | 01/99207 A2 | 12/2001 | |
| WO | 02/02714 A2 | 1/2002 | |
| WO | 0200759 A1 | 1/2002 | |
| WO | 0205354 A1 | 1/2002 | |
| WO | 02/15645 A1 | 2/2002 | |
| WO | 02/065484 A1 | 8/2002 | |
| WO | 02/080627 A2 | 10/2002 | |
| WO | 02079316 A2 | 10/2002 | |
| WO | 02/099907 A1 | 12/2002 | |
| WO | 03/006537 A1 | 1/2003 | |
| WO | WO 03/008424 A1 | 1/2003 | |
| WO | 03/012908 A2 | 2/2003 | |
| WO | WO 03/040257 A1 | 5/2003 | |
| WO | 03/048228 A1 | 6/2003 | |
| WO | 03/050824 A1 | 6/2003 | |
| WO | WO 03/063555 A1 | 7/2003 | |
| WO | 03/074601 A2 | 9/2003 | |
| WO | WO 03/091688 A2 | 11/2003 | |
| WO | WO 2004/016710 A1 | 2/2004 | |
| WO | 2004/020444 A1 | 3/2004 | |
| WO | 2004018544 A1 | 3/2004 | |
| WO | 2004/029176 A1 | 4/2004 | |
| WO | 2004029133 A1 | 8/2004 | |
| WO | 2004/106404 A1 | 9/2004 | |
| WO | 2004094501 A2 | 11/2004 | |
| WO | 2005098872 A2 | 10/2005 | |
| WO | 2007/002740 A2 | 1/2007 | |
| WO | 2007002681 A2 | 1/2007 | |

OTHER PUBLICATIONS

Sotzing et al., Poly(thieno[3,4-b]thiophene): A p- and n-Dopable Polythiophene Exhibiting High Optical Transparency in the Semi-conducting State, Macromolecules, 2002, vol. 35:7281-7286.
Feiring et al., Aromatic Monomers With Pendant Fluoroalkylsulfonate and Sulfonimide Groups, J. Fluorine Chemistry, 2000, vol. 105:129-135.
A. Feiring et al., Novel Aromatic Polymers With Pendant Lithium Perfluoroalkylsulfonate or Sulfonimide Groups, Macromolecules, 2000, vol. 33:9262-9271.
D.D. Desmarteau, Novel Perfluorinated Ionomers and Ionenes, J. Fluorine Chem., 1995, vol. 72:203-208.
A.J. Appleby et al., Polymeric Perfluoro Bis-Sulfonimides as Possible Fuel Cell Electrolytes, J. Electrochem. Soc., 1993, vol. 140:109-111.
Gustafsson et al., Flexible Light-Emitting Diodes Made From Soluble Conducting Polymers, Nature, 1992, vol. 357:477-479.
Y. Wang, Photoconductive Polymers, Kirk-Othmer Encyclopedia of Chemical Technology, Fourth Edition, 1996,vol. 18:837-860.
Baytron Coating Guide Issue Oct. 2002—Obtained From www.hcstarck-echemicals.com.
Baytron P VAP A1 4083 and Baytron P VP CH 8000 Product Information for Electronic Grades Designed for Use as Hole-Injection Material in OLEDS—Obtained From www.hcstarck-echemicals.com, Jun. 9, 2004.
Baytron Product info from baytron.com; 20070801.
Colvin et al—Light-Emitting Diodes Made From Cadmium Selenide Nanocrystals and a Semiconducting Polymer, Nature, 1994, vol. 370 pp. 354-357.
Conductive Polymer From Wikipedia, The Free Encyclopedia, Nov. 17, 2006.
Database CA [Online] Chemical Abstracts Service, Columbus, Ohio, US; Takei, Masashi et al: Metal colloid solution, electric conductor ink, electric conductor coating, and undercoating film for forming electric conductor coating layer, retrieved from STN Database accession No. 2001:847689.
Database CA [Online] Chemical Abstracts Service, Columbus, Ohio, US; Wakita, Katsuya et al: "High performance odor sensors and mthod for their manufacture," retrieved from STN Database accession No. 2002:219874.
Partial European Search Report; Application No. EP10005557.3; 20100628.
Gao, J. et al., Soluble polypyrrole as the transparent anode in polymer light-emitting diodes, Synthetic Metals, 1996, 221-223, 82, Elsevier Science S.A.
Hong et al, "Association of Nafion with Polypyrrole Nanoparticles in a Hydrophilic Polymer Network: Effects on Proton Transport," Journal of Colloid and Interface Science, vol. 218 pp. 233-242; 19991001.
HSU Novel Preparation and Properties of Conductive Polyaniline/Nafion Film, Synthetic Metals, 1991, 41-43, pp. 671-674.
Lefebvre et al—Chemical Synthesis, Characterization, and Electrochemical Studies of Poly(3,4-ethylenedioxythiophen)/Poly(styrene-4-sulfonate) Composites, Chem Mater, 1999, vol. 11 pp. 262-268.
Levi et al—Polymer and Cathode Emission Studies of Polymer-Based Light-Emitting Diodes Under Strong Electrial Pulse Excitation, Journal of Applied Physics, 2000 vol. 88 No. 5 pp. 2548-2552.
Lim et al—Degradation of Organic Light-Emitting Devices Due to Formation and Growth of Dark Spots, Materials Science and Engineering 2001, pp. 154-159.
Madler et al—Visibly Transparent and Radiopaque Inorganic Organic Composites From Flange-Made Mixed-Oxide Fillers. Journal of Nanoparticle Research, vol. 8, No. 3-4, 2005, p. 323-333.
Opposition Against EP 1 546 237 B1, E. I. du Pont de Nemours and Company, Wilmington, Delaware, Observations of the Patent Proprietor, Mar. 1, 2010.
Opposition Against EP 1 546 237 B1, E. I. du Pont de Nemours and Company, Wilmington, Delaware, Observations of the Patent Proprietor, Mar. 1, 2010, Annex, Declaration of Dr Hjalti Skulason dated Feb. 24, 2010.
Opposition Against EP 1 546 237 B1, H. C. Starck Clevios GmbH, Goslar, Germany, May 13, 2009 (English Translation).
Opposition Against EP 1 546 237 B1, H. C. Starck Clevios GmbH, Goslar, Germany, May 13, 2009 (German Original).
Opposition Against EP 1 615 971 B1, H. C. Starck Clevios GmbH, Goslar, Germany, Mar. 2, 2010 (English Translation).
Opposition Against EP 1 615 971 B1, H. C. Starck Clevios GmbH, Goslar, Germany, Mar. 2, 2010 (German Original).
Pickup—Electronically Conducting cation-exchange Polymer Powders: Synthesis, Characterization and Applications in PEM Fuel Cells and Supercapacitors, Journal of New Materials, 3, 2000, pp. 21-26.
Qi et al—Size Control of Polypyrrole Particles, Chem Mater., 1997, 9, pp. 2934-2939.
Römpp Chemistry Dictionary, Falbe, 9th Edition, 1993.
Schroedner et al—Organische Feldeffekttransistoren Auf Basis Halbleitender Polymere/Organic Field-Effect Transistors Based on Semiconducting Polymers. Elektrotechnik Und Informationstechnik, Springer Verlag. 2003 vol. 120 No. 6, pp. 205-209.
Sharpe et al—Improved Cationic Conductive Polymer, Calgon Corp, Coating Conference (Proceeding) 1981 pp. 83-87.
Simpson et al.—Advances and Applications of Inherently Conductive Polymer Technologies Based on Poly(3,4-Ethylenedioxythiophene) 2005 AIMCAL Fall Technical Conference.
Sun, Zaicheng et al, Catalytic Oxidation Polymerization of Aniline in an H2O2-Fe2+ System, Journal Applied Polymer Science, vol. 72, pp. 1077-1084, 1999.

Thelakkat et al—Poly(Triarylamine)S-Synthesis and Application in Electroluminescent Devices and Photovoltaics, Synthetic Metals, 1999, vol. 102 pp. 1125-1128.

Nafion Definition; Wikipedia; 20100218.

Extended European Search Report; Application No. EP 10011570.8; 20110517.

Extended European Search Report; Application No. EP 10005557.3; 20101201.

PCT International Search Report for International Application No. PCT/US2003/030509; C. Meiners Authorized Officer Feb. 17, 2004.

PCT International Search Report for International Application No. PCT/US2003/030512; R. Kiebooms Authorized Officer Feb. 19, 2004.

PCT International Search Report for International Application No. PCT/US2005/008563; R. Kiebooms Authorized Officer Jun. 17, 2005.

PCT International Search Report for International Application No. PCT/US2005/008561; G. Wolfbauer Authorized Officer Jun. 30, 2005.

PCT International Search Report for International Application No. PCT/US2005/008763; F. Rousseau Authorized Officer Aug. 3, 2005.

PCT International Search Report for International Application No. PCT/US2009/037461; Christian Meiners Authorized Officer Jan. 7, 2009.

CRC Handbook of Chemistry and Physics, $81^{ST}$ Edition, 2000-2001. (Book Not Included).

Lee et al., Poly(thieno[3,4-b]thiophene). A New Stable Low Band Gap Conducting Polymer, Macromolecules, 2001, vol. 34:5746-5747.

Sotzing et al., Poly(thieno[3,4-b]thiophene): A p- and n-Dopable Polythiophene Exhibiting High Optical Transparency in the Semiconducting State, Macromolecules, 2002, vol. 35:7281-7286.

Feiring et al., Aromatic Monomers with Pendant Fluoroalkylsulfonate and Sulfonimide Groups, J. Fluorine Chemistry, 200, vol. 105-129-135.

A. Feiring et al., Novel Aromatic Polymers With Pendant Lithium Perfluoralkysulfonate or Sulfonimide Groups, Macromolecules, 2000, vol. 33:9262-9271.

D.D. Desmarteau, Novel Perfluorinated Ionomers and Ionenes, J. Fluorine Chem., 1995, vol. 72:203-208.

A.J. Appleby et al., Polymeric Perfluoro Bis-Sulfonimides as Possible Fuel Cell Electrolytes, J. Electrochem. Soc., 1993, vol. 140:109-111.

Gustafsson et al., Flexible Light-Emitting Diodes Made From Soluble Conducting Polymers, Nature, 1992, vol. 357:477-479.

Y. Wang, Photoconductive Polymers, Kirk-Othmer Encyclopedia of Chemical Technology, Fourth Edition, 1996, vol. 18:837-860.

Campbell, I.H. et al., "Excitation Transfer Processes in a Phosphor-Doped Poly 9p-phenylene vinylene) Light-Emitting Diode," Physical Review B., vol. 65, 085210-1-085210-8.

Database CA [Online] Chemical Abstracts Service, American Chemical Society, vol. 131, No. 158220, Jun. 7, 1999, Columbus, OH, US; Agibalova, L.V. et al; "Supramolecular Organization of Polyfluorinated Copolymers in Solutions" Vysokomolkuyarnye Soedineniya, Seriya A I Seriya B, 40 [6], 1009-1016, 1998, XP002564423; Abstract No. 1999:343805.

Markus et al—Electronics and Nuleonics Dictionary, pp. 470-471 & 476 (McGraw-Hill 1966).

CAS reg. No. 126213-51-2, Apr. 6, 1990.

CAS reg. No. 31175-20-9, Nov. 16, 1984.

ISR 20080509; PCT International Search Report for Application No. PCT/US2007/026512; Bernhard Glomm, Authorized Officer; May 9, 2008.

ISR 20070725; PCT International Search Report for International Application No. PCT/US2006/025014; Lee W. Young, Authorized Officer; Jul. 25, 2007.

* cited by examiner

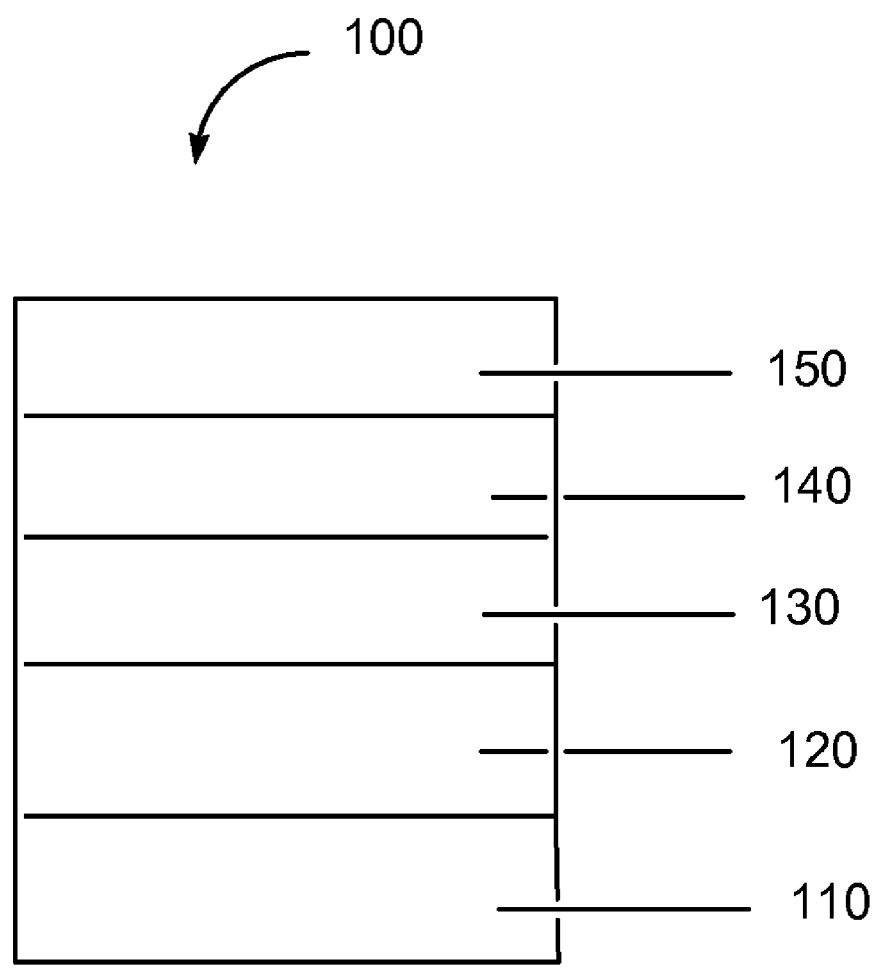

LASER (230NM) ABLATABLE COMPOSITIONS OF ELECTRICALLY CONDUCTING POLYMERS MADE WITH A PERFLUOROPOLYMERIC ACID APPLICATIONS THEREOF

BACKGROUND INFORMATION

1. Field of the Disclosure

This disclosure relates in general to laser ablatable compositions of electrically conducting polymers doped with fluorinated polymeric acids.

2. Description of the Related Art

Conducting polymers are useful in many electronic devices. In some cases the polymers are used in organic light-emitting diodes ("OLEDs"). Such devices comprise a light-emitting layer between two electrical contact layers, an anode and a cathode. The conducting polymer can function as a buffer layer between the anode and the light-emitting layer.

In the fabrication of OLEDs, organic materials are frequently deposited in areas outside the active areas of the device, from which they must ultimately be removed. For example, the materials are sometimes deposited over electrical contacts or in areas where encapsulating materials are to be adhered. One way to remove the organic materials is by laser ablation. However, many conductive polymers are transparent at the laser wavelength, and thus are difficult to remove. There is a need for laser ablatable electrically conducting polymers.

SUMMARY

There is provided a composition comprising (a) an aqueous dispersion of at least one electrically conductive polymer doped with at least one highly-fluorinated acid polymer and (b) a second material selected from a second polymeric acid, an acid salt of the second polymeric acid, and combinations thereof.

In another embodiment, there is provided a film formed from the above composition.

In another embodiment, electronic devices comprising at least one layer comprising the above film are provided.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes as illustration a schematic diagram of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are described herein and are merely exemplary and not limiting. After reading this specification, skilled artisans will appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Electrically Conductive Polymer, the Highly-fluorinated Acid Polymer, the Second Polymeric Acid and Salt, Preparation of the Doped Electrically Conductive Polymer Composition, Buffer Layers, Electronic Devices, and finally, Examples.

1. DEFINITIONS AND CLARIFICATION OF TERMS

Before addressing details of embodiments described below, some terms are defined or clarified.

The term "conductor" and its variants are intended to refer to a layer material, member, or structure having an electrical property such that current flows through such layer material, member, or structure without a substantial drop in potential. The term is intended to include semiconductors. In some embodiments, a conductor will form a layer having a conductivity of at least $10^{-7}$ S/cm.

The term "electrically conductive" as it refers to a material, is intended to mean a material which is inherently or intrinsically capable of electrical conductivity without the addition of carbon black or conductive metal particles.

The term "polymer" is intended to mean a material having at least one repeating monomeric unit. The term includes homopolymers having only one kind, or species, of monomeric unit, and copolymers having two or more different monomeric units, including copolymers formed from monomeric units of different species.

The term "acid polymer" refers to a polymer having acidic groups.

The term "acidic group" refers to a group capable of ionizing to donate a hydrogen ion to a Brønsted base.

The term "highly-fluorinated" refers to a compound in which at least 90% of the available hydrogens bonded to carbon have been replaced by fluorine.

The terms "fully-fluorinated" and "perfluorinated" are used interchangeably and refer to a compound where all of the available hydrogens bonded to carbon have been replaced by fluorine.

The composition may comprise one or more different electrically conductive polymers and one or more different highly-fluorinated acid polymers.

The term "doped" as it refers to an electrically conductive polymer, is intended to mean that the electrically conductive polymer has a polymeric counterion to balance the charge on the conductive polymer.

The term "doped conductive polymer" is intended to mean the conductive polymer and the polymeric counterion that is associated with it.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer.

The term "nanoparticle" refers to a material having a particle size less than 100 nm. In some embodiments, the particle size is less than 10 nm. In some embodiments, the particle size is less than 5 nm.

The term "aqueous" refers to a liquid that has a significant portion of water, and in one embodiment it is at least about 40% by weight water; in some embodiments, at least about 60% by weight water.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "electron transport" means when referring to a layer, material, member or structure, such a layer, material, member or structure that promotes or facilitates migration of negative charges through such a layer, material, member or structure into another layer, material, member or structure.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81st Edition (2000-2001).

Unless otherwise defined, all technical and scientific terms used herein have the same meaning as commonly understood by one of ordinary skill in the art to which this invention belongs. In the Formulae, the letters Q, R, T, W, X, Y, and Z are used to designate atoms or groups which are defined within. All other letters are used to designate conventional atomic symbols. Group numbers corresponding to columns within the Periodic Table of the elements use the "New Notation" convention as seen in the *CRC Handbook of Chemistry and Physics*, 81st Edition (2000).

To the extent not described herein, many details regarding specific materials, processing acts, and circuits are conventional and may be found in textbooks and other sources within the organic light-emitting diode display, lighting source, photodetector, photovoltaic, and semiconductive member arts.

2. ELECTRICALLY CONDUCTIVE POLYMERS

The conductive polymers suitable for the new composition are made from at least one monomer which, when polymerized alone, forms an electrically conductive homopolymer. Such monomers are referred to herein as "conductive precursor monomers."

The conductive polymer is made from at least one precursor monomer selected from thiophenes, selenophenes, tellurophenes, pyrroles, thienothiophenes, and thienoselenophenes. The polymers made from these monomers are referred to herein as polythiophenes, poly(selenophenes), poly(tellurophenes), polypyrroles, poly(thienothiophenes), and poly(thienoselenophenes), respectively.

In some embodiments, monomers contemplated for use to form the electrically conductive polymer in the new composition comprise Formula I below:

(I)

wherein:
Q is selected from the group consisting of S, Se, and Te;
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | —$R^3$—OH |
| "amido" | —$R^3$—C(O)N($R^6$) $R^6$ |
| "amidosulfonate" | —$R^3$—C(O)N($R^6$) $R^4$—$SO_3Z$ |
| "benzyl" | —$CH_2$—$C_{36}H_5$ |
| "carboxylate" | —$R^3$—C(O)O—Z or —$R^3$—O—C(O)—Z |
| "ether" | —$R^3$—(O—$R^5$)$_p$—O—$R^5$ |
| "ether carboxylate" | —$R^3$—O—$R^4$—C(O)O—Z or —$R^3$—O—$R^4$—O—C(O)—Z |
| "ether sulfonate" | —$R^3$—O—$R^4$—$SO_3Z$ |
| "ester sulfonate" | —$R^3$—O—C(O)—$R^4$—$SO_3Z$ |
| "sulfonimide" | —$R^3$—$SO_2$—NH—$SO_2$—$R^5$ |
| "urethane" | —$R^3$—O—C(O)—N($R^6$)$_2$ | where all "R" groups are the same or different at each occurrence
and:
$R^3$ is a single bond or an alkylene group
$R^4$ is an alkylene group
$R^5$ is an alkyl group
$R^6$ is hydrogen or an alkyl group
p is 0 or an integer from 1 to 20
Z is H, alkali metal, alkaline earth metal, N($R^5$)$_4$ or $R^5$ Any of the above groups may further be unsubstituted or substituted, and any group may have F substituted for one or more hydrogens, including perfluorinated groups. In some embodiments, the alkyl and alkylene groups have from 1-20 carbon atoms.

In some embodiments, in the monomer, both $R^1$ together form —W—$(CY^1Y^2)_m$—W—, where m is 2 or 3, W is O, S, Se, PO, $NR^6$, $Y^1$ is the same or different at each occurrence and is hydrogen or fluorine, and $Y^2$ is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In some embodiments, all Y are hydrogen. In some embodiments, the polymer is poly(3,4-ethylenedioxythiophene). In some embodiments, at least one Y group is not hydrogen. In some embodiments, at least one Y group is a substituent having F substituted for at least one hydrogen. In some embodiments, at least one Y group is perfluorinated.

In some embodiments, the monomer has Formula I(a):

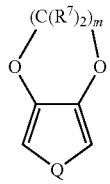

(Ia)

wherein:
Q is selected from the group consisting of S, Se, and Te;
$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and
m is 2 or 3.

In some embodiments of Formula I(a), m is two, one $R^7$ is an alkyl group of more than 5 carbon atoms, and all other $R^7$ are hydrogen. In some embodiments of Formula I(a), at least one $R^7$ group is fluorinated. In some embodiments, at least one $R^7$ group has at least one fluorine substituent. In some embodiments, the $R^7$ group is fully fluorinated.

In some embodiments of Formula I(a), the $R^7$ substituents on the fused alicyclic ring on the monomer offer improved solubility of the monomers in water and facilitate polymerization in the presence of the fluorinated acid polymer.

In some embodiments of Formula I(a), m is 2, one $R^7$ is sulfonic acid-propylene-ether-methylene and all other $R^7$ are hydrogen. In some embodiments, m is 2, one $R^7$ is propyl-ether-ethylene and all other $R^7$ are hydrogen. In some embodiments, m is 2, one $R^7$ is methoxy and all other $R^7$ are hydrogen. In some embodiments, one $R^7$ is sulfonic acid difluoromethylene ester methylene (—$CH_2$—O—C(O)—$CF_2$—$SO_3H$), and all other $R^7$ are hydrogen.

In some embodiments, pyrrole monomers contemplated for use to form the electrically conductive polymer in the new composition comprise Formula II below.

(II)

where in Formula II:
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and
$R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In some embodiments, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In some embodiments, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In some embodiments, the pyrrole monomer is unsubstituted and both $R^1$ and $R^2$ are hydrogen.

In some embodiments, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In some embodiments, both $R^1$ together form a 6- or 7-membered alicyclic ring, which is further substituted with an alkyl group. In some embodiments, both $R^1$ together form a 6- or 7-membered alicyclic ring, which is further substituted with an alkyl group having at least 1 carbon atom.

In some embodiments, both $R^1$ together form —O—$(CHY)_m$—O—, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In some embodiments, at least one Y group is not hydrogen. In some embodiments, at least one Y group is a substituent having F substituted for at least one hydrogen. In some embodiments, at least one Y group is perfluorinated.

In some embodiments, monomers contemplated for use to form the electrically conductive polymer in the new composition comprise Formula III or Formula IV below:

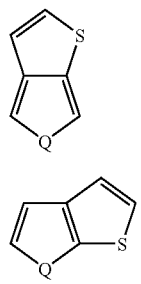

(III)

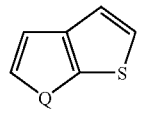

(IV)

wherein Q is S, Se, or Te.

The conductive monomers having Formula III or IV may be further substituted with groups selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

In some embodiments, conductive monomer is a thieno (thiophene). Such compounds have been discussed in, for example, Macromolecules, 34, 5746-5747 (2001); and Macromolecules, 35, 7281-7286 (2002). In some embodiments, the conductive monomer is a thieno(selenophene). In some embodiments, the thieno(thiophene) is selected from thieno (2,3-b)thiophene, thieno(3,2-b)thiophene, and thieno(3,4-b) thiophene. In some embodiments, the thieno(thiophene) monomer is further substituted with at least one group selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

3. HIGHLY-FLUORINATED ACID POLYMER

The highly-fluorinated acid polymer ("HFAP") can be any polymer which is highly-fluorinated and has acidic groups with acidic protons. The acidic groups supply an ionizable proton. In some embodiments, the acidic proton has a pKa of less than 3. In some embodiments, the acidic proton has a pKa of less than 0. In some embodiments, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group. In some embodiments, the acidic groups are selected from the group consisting of sulfonic acid groups, sulfonamide groups, and combinations thereof.

In some embodiments, the HFAP is at least 95% fluorinated; in some embodiments, fully-fluorinated.

In some embodiments, the HFAP is water-soluble. In some embodiments, the HFAP is dispersible in water. In some embodiments, the HFAP is organic solvent wettable. The term "organic solvent wettable" refers to a material which, when formed into a film, possesses a contact angle no greater than 60° C. with organic solvents. In some embodiments, wettable materials form films which are wettable by phenylhexane with a contact angle no greater than 55°. The methods for measuring contact angles are well known. In some embodiments, the wettable material can be made from a polymeric acid that, by itself is non-wettable, but with selective additives it can be made wettable.

Examples of suitable polymeric backbones include, but are not limited to, polyolefins, polyacrylates, polymethacrylates, polyimides, polyamides, polyaramids, polyacrylamides, polystyrenes, and copolymers thereof, all of which are highly-fluorinated; in some embodiments, fully-fluorinated.

In one embodiment, the acidic groups are sulfonic acid groups or sulfonimide groups. A sulfonimide group has the formula:

—SO$_2$—NH—SO$_2$—R where R is an alkyl group.

In one embodiment, the acidic groups are on a fluorinated side chain. In one embodiment, the fluorinated side chains are selected from alkyl groups, alkoxy groups, amido groups, ether groups, and combinations thereof, all of which are fully fluorinated.

In one embodiment, the HFAP has a highly-fluorinated olefin backbone, with pendant highly-fluorinated alkyl sulfonate, highly-fluorinated ether sulfonate, highly-fluorinated ester sulfonate, or highly-fluorinated ether sulfonimide groups. In one embodiment, the HFAP is a perfluoroolefin having perfluoro-ether-sulfonic acid side chains. In one embodiment, the polymer is a copolymer of 1,1-difluoroethylene and 2-(1,1-difluoro-2-(trifluoromethyl)allyloxy)-1,1, 2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the HFAP is homopolymer or copolymer of a fluorinated and partially sulfonated poly(arylene ether sulfone). The copolymer can be a block copolymer.

In one embodiment, the HFAP is a sulfonimide polymer having Formula IX:

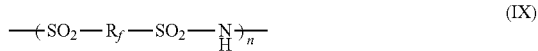

(IX)

where:
R$_f$ is selected from highly-fluorinated alkylene, highly-fluorinated heteroalkylene, highly-fluorinated arylene, and highly-fluorinated heteroarylene, which may be substituted with one or more ether oxygens; and
n is at least 4.

In one embodiment of Formula IX, R$_f$ is a perfluoroalkyl group. In one embodiment, R$_f$ is a perfluorobutyl group. In one embodiment, R$_f$ contains ether oxygens. In one embodiment n is greater than 10.

In one embodiment, the HFAP comprises a highly-fluorinated polymer backbone and a side chain having Formula X:

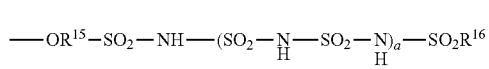

where:
R$^{15}$ is a highly-fluorinated alkylene group or a highly-fluorinated heteroalkylene group;
R$^{16}$ is a highly-fluorinated alkyl or a highly-fluorinated aryl group;
and
a is 0 or an integer from 1 to 4.

In one embodiment, the HFAP has Formula XI:

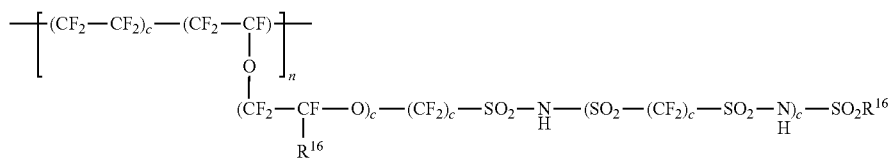

where:
R$^{16}$ is a highly-fluorinated alkyl or a highly-fluorinated aryl group;
c is independently 0 or an integer from 1 to 3; and
n is at least 4.

The synthesis of HFAPs has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the HFAP also comprises a repeat unit derived from at least one highly-fluorinated ethylenically unsaturated compound. The perfluoroolefin comprises 2 to 20 carbon atoms. Representative perfluoroolefins include, but are not limited to, tetrafluoroethylene, hexafluoropropylene, perfluoro-(2,2-dimethyl-1,3-dioxole), perfluoro-(2-methylene-4-methyl-1,3-dioxolane), CF$_2$=CFO(CF$_2$)$_t$CF=CF$_2$, where t is 1 or 2, and R$_f$"OCF=CF$_2$ wherein R$_f$" is a saturated perfluoroalkyl group of from 1 to about ten carbon atoms. In one embodiment, the comonomer is tetrafluoroethylene.

In one embodiment, the HFAP is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any highly-fluorinated colloid-forming polymeric material having acidic protons can be used. Some of the polymers described hereinabove may be formed in non-acid form, e.g., as salts, esters, or sulfonyl fluorides. They will be converted to the acid form for the preparation of conductive compositions, described below.

In some embodiments, HFAP include a highly-fluorinated carbon backbone and side chains represented by the formula

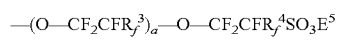

wherein R$_f^3$ and R$_f^4$ are independently selected from F, Cl or a highly-fluorinated alkyl group having 1 to 10 carbon atoms, a=0, 1 or 2, and E$^5$. In some cases E$^5$ can be a cation such as Li, Na, or K, and be converted to the acid form.

In some embodiments, the HFAP can be the polymers disclosed in U.S. Pat. No. 3,282,875 and in U.S. Pat. Nos. 4,358,545 and 4,940,525. In some embodiments, the HFAP comprises a perfluorocarbon backbone and the side chain represented by the formula

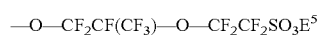

where E$^5$ is as defined above. HFAPs of this type are disclosed in U.S. Pat. No. 3,282,875 and can be made by copolymerization of tetrafluoroethylene (TFE) and the perfluorinated vinyl ether CF$_2$=CF—O—CF$_2$CF(CF$_3$)—O—CF$_2$CF$_2$ SO$_2$F, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—CF$_2$CF$_2$SO$_3$E$^5$, wherein E$^5$ is as defined above. This polymer can be made by copolymerization of tetrafluoroethylene (TFE) and the perfluorinated vinyl ether CF$_2$=CF—O—CF$_2$CF$_2$SO$_2$F, perfluoro(3-oxa-4-pentenesulfonyl fluoride) (POPF), followed by hydrolysis and further ion exchange as necessary.

One type of HFAP is available commercially as aqueous Nafion® dispersions, from E. I. du Pont de Nemours and Company (Wilmington, Del.).

4. SECOND POLYMERIC ACID AND SALT

The conductive polymer composition includes a second material which is a second polymeric acid and/or a salt of the acid. The second polymeric acid is different from the HFAP with which the conducting polymer is doped. The second polymeric acid is one that absorbs light at the desired wavelength and does not detrimentally affect the properties of the conducting polymer. In some embodiments, the acid absorbs light in the wavelength range of 200 to 350 nm; in some embodiments, 200 to 250 nm. In some embodiments, a 100 nm thick film made from a conductive polymer composition which contains the second acid and/or acid salt, has an optical absorbance which is at least 0.05 absorbance units greater than the absorbance of a 100 nm film made from the conductive polymer without the second acid or acid salt, in at least one wavelength in the range of 200-350 nm. In some embodiments, the film has an optical absorbance of at least 0.10.

In some embodiments, the second polymeric acid is partially fluorinated, but not highly fluorinated. In some embodiments, the second polymeric acid is less than 30% fluorinated. In some embodiments, the second polymeric acid is non-fluorinated.

In some embodiments, the second polymeric acid is a sulfonic acid or sulfonimide. Some examples of polymeric sulfonic acids include, but are not limited to, polystyrene sulfonic acid, poly(acrylamidomethanesulfonic acid), polyvinylsulfonic acid, and combinations thereof.

In some embodiments of the new conductive composition, the second polymeric acid is present.

In some embodiments of the new conductive composition, the acid salt of the second polymeric acid is present. In some embodiments, the cation of the acid salt is selected from the group consisting of alkali metal ions, alkaline earth metal ions, ammonium, alkylammonium, and combinations thereof. In some embodiments, the cation is selected from sodium and potassium ions.

In some embodiments, a combination of second polymeric acid and the acid salt is present.

The relative amount of second polymeric acid and acid salt can range from all acid to all acid salt. In some embodiments, the ratio of second polymeric acid to acid salt ranges from 10:1 to 1:10; in some embodiments, the ratio is in the range of 5:1 to 1:5.

5. PREPARATION OF THE DOPED ELECTRICALLY CONDUCTIVE POLYMER COMPOSITIONS

In the following discussion, the conductive polymer, HFAP, and second polymeric acid and acid salt will be referred to in the singular. However, it is understood that more than one of any or all of these may be used.

The new electrically conductive polymer composition is prepared by first forming the doped conductive polymer and then adding the second polymeric acid and/or acid salt.

The doped electrically conductive polymer is formed by oxidative polymerization of the precursor monomer in the presence of the HFAP in an aqueous medium. The polymerization has been described in published U.S. patent applications 2004/0102577, 2004/0127637, and 2005/0205860.

The second polymeric acid salt can be added to the doped conductive polymer dispersion directly as a solid. In some embodiments, the second polymeric acid and/or acid salt are dissolved or dispersed in an aqueous solution, and this aqueous solution or dispersion is mixed with the doped conductive polymer dispersion.

In some embodiments, the second polymeric acid is added in acid form, followed by the addition of a base. This converts some of the acid to the salt form and increases the pH. The dispersions of doped conductive polymer and second polymeric acid remain stable from the as-formed pH of about 2, to neutral pH. The pH can also be adjusted by treatment with cation exchange resins.

The acid equivalent ratio of the sum of the second polymeric acid and the second polymeric acid salt anion to HFAP is no greater than 1.0. In some embodiments the ratio is no greater than 0.7. In some embodiments, the ratio is in the range of 0.1 to 0.6. As used herein, the acid equivalent of the polymeric acid salt is calculated as if it were in acid form.

Films made from the new conductive composition described herein, are hereinafter referred to as "the new films described herein". The films can be made using any liquid deposition technique, including continuous and discontinuous techniques. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

6. BUFFER LAYERS

In another embodiment of the invention, there are provided buffer layers deposited from aqueous dispersions comprising the new conductive polymer composition. The term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The dried films of the new conductive polymer composition are generally not redispersible in water. Thus the buffer layer can be applied as multiple thin layers. In addition, the buffer layer can be overcoated with a layer of different water-soluble or water-dispersible material without being damaged. Buffer layers comprising the new conductive polymer composition have been surprisingly found to have improved wettability.

In another embodiment, there are provided buffer layers deposited from aqueous dispersions comprising the new conductive polymer composition blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers. Examples of suitable polymers include, but are not limited to, conductive polymers such as polythiophenes, polyanilines, polypyrroles, polyacetylenes, poly(thienothiophenes), and combinations thereof.

7. ELECTRONIC DEVICES

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electroradiative properties. An electroactive layer material may emit radiation or exhibit a change in concentration of electron-hole pairs when receiving radiation.

As shown in FIG. 1, a typical device, 100, has an anode layer 110, a buffer layer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent to the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer layer 120 comprises the new conductive composition described herein. Buffer layers made from conductive polymers doped with HFAPs, generally are not laser ablatable and therefore cannot be removed from areas such as the sealing area, by ablation. The buffer layers described herein have more absorbance at the laser wavelengths and thus are more easily removed by ablation. The buffer layer is usually deposited onto substrates using a variety of techniques well-known to those skilled in the art. Typical deposition techniques, as discussed above, include vapor deposition, liquid deposition (continuous and discontinuous techniques), and thermal transfer.

An optional layer, not shown, may be present between the buffer layer 120 and the electroactive layer 130. This layer may comprise hole transport materials. Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinolato)(para-phenyl-phenolato)aluminum(III) (BAlQ) and tris(8-hydroxyquinolato)aluminum ($Alq_3$); tetrakis(8-hydroxyquinolinato)zirconium; azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110 the hole transport layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; buffer layer 120, 50-2000 Å, in one embodiment 200-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

EXAMPLES

The concepts described herein will be further described in the following examples, which do not limit the scope of the invention described in the claims.

Comparative Example 1

This comparative example illustrates low optical absorbance (@222 nanometer) of a thin film spin-coated from an aqueous dispersion of polypyrrole (PPy) made in the presence of Nafion® [Copolymer of TFE (tetrafluoroethylene) and PSEPVE (3,6-dioxa-4-methyl-7-octenesulfonic acid).

In this example, aqueous dispersion of Nafion® was prepared by heating poly(TFE/PSEPVE) having EW of 1000 in water to ~270° C. The aqueous Nafion® dispersion had 25% (w/w) poly(TFE/PSEPVE) in water and was diluted to 11.3% with deionized water prior to the use for polymerization with pyrrole.

Pyrrole monomer was polymerized in the presence of the Nafion® dispersion as described in published U.S. patent application 2005-0205860. The polymerization ingredients have the following mole ratios: Nafion®/Pyrrole: 2.5, $Na_2S_2O_8$/pyrrole: 0.9, $Fe_2(SO_4)_3$/pyrrole: 0.11. The reaction was allowed to proceed for 30 minutes before addition of ~400 mL of wet Dowex M31 and ~600 mL of wet Dowex M43. Both resins are from Dow Chemicals Company, Midland, Mich., USA. After 1.5 hours, the resins were filtered off with a plastic mesh. The aqueous PPy/poly(TFE-PSEPVE) dispersion was then pumped through Lewatit Monoplus column and subsequently degassed and microfluidized with on pass at 5,000 psi with a Microfluidizer Processor M-110Y (Microfluidics, Massachusetts, USA). pH of the dispersion was measured to be 4.1 using a standard pH meter and solid % was determined to be 8.0% by a gravimetric method. Films spin-coated from the dispersion and then baked at 130° C. in air for 10 minutes have conductivity of $2.6 \times 10^{-3}$ S/cm at room temperature.

Thin film preparation from the dispersion for optical absorbance was done in the following manner. Three drops of the dispersion taken with a glass pipet were placed on a quartz plate for spin-coating at 1,000 rpm. The coated films were then dried in air on a hot plate set at 100° C. The film-coated quartz was then placed in optical path of the nitrogen-filled chamber in Varian Cary 5000 UV/Visble/Near-IR Spectrometer. Optical absorbance spectrum was scanned from 800 nm (Nanometer) to 200 nm. Absorbance at 222 nm peak was taken for calculation of absorbance per 100 nm. Film thickness was taken using a standard profilomter. The optical absorbance data is summarized in Table I. It only has 0.013 abs/100 nm. The absorbance is low, therefore PPy/poly(TFE/PSEPVE) on the unwanted areas of organic light emitting diodes (OLEDs) cannot be easily ablated by 230 nm laser beam, which is commonly used for this purpose in OLEDs industries.

The aqueous dispersion was also tested as a hole injection layer, or also called buffer layer, for organic light emitting diode (OLED). The OLED was fabricated to the following specifications: 6×6" (4 totals with 300 $mm^2$ active area) substrates containing patterned indium-tin-oxide anodes, were cleaned in an oxygen plasma (300 W) for 10 minutes. Then approximately 80 nm thick film of PPy/Poly(TFE-PSEPVE) was spun followed by baking at 130° C. on a hotplate in air for 10 minutes. After cooling down to room temperature, the plate was spun with approximately 75 nm thick film of Lumnation Green 1303 electroluminescent polymer from Dow Chemicals (from 1% w/v solution in p-Xylene) in air. Following the baking of the electroluminescent film at 130° C. in a vacuum oven for 30 minutes, a cathode consisting of 3 nm of Ba (barium) and 300 nm of Al (aluminum) was thermally evaporated at pressure less then $10^{-6}$ Torr. Encapsulation of the devices was achieved by bonding a glass slide on the back of the devices using an UV-curable epoxy resin.

Table 1 shows device efficiency and voltage @2,000 nits ($cd/m^2$), and lifetime (T50) with four devices stressed at a constant current of 30 $mA/cm^2$ at room temperature.

Example 1A, 1B and 1C

This set of examples illustrates enhanced optical absorbance (@222 nanometer) of polypyrrole/poly(TFE-PSEPVE) with addition of poly(styrenesulfonic acid) sodium salt, PSSNa, or a mixture of PSSNa and Poly(styrenesulfonic acid), PSSA.

Example 1A

Addition with PSSNA Only without Changing pH of the Aqueous PPy/Poly(TFE-PSEPVE) Dispersion and its Effect on Device Performance The aqueous PPy/Poly(TFE-PSEPVE) dispersion made in Comparative Example 1 was used for addition with an aqueous solution of poly(styrenesulfonic acid) sodium salt, $PSS^-Na^+$. The dispersion contains 8.0% PPy/poly(TFE-PSEPVE) polymer and its pH is 4.1. The PSSNa solution used for the addition was prepared by adding 101.4 g water to 18.6 g PSSNa (Cat. #08772, PolySciences, Inc.) contained in a glass vial. Actual % was determined to be 14.1% after degassed. The aqueous PSSNa solution was transferred to an oxygen free box for mixing with the PPy/poly(TFE-PSEPVE).

55.0 g PPy/poly(TFE-PSEPVE) was slowly added with 3.773 g PSSNa solution in the oxygen free box. The weight of the two components was calculated to be 0.6 $PSS^-$ per one acid equivalent of poly(TFE-PSEPVE). The amount of PSSNa constitutes 0.6% (w/w) of the final dispersion, which was measured to have pH of 4.1. pH of the PPy/poly(TFE-PSEPVE) was maintained by adding the PSSNa.

The PSSNa containing PPy/poly(TFE-PSEPVE) dispersion was also measured for optical absorbance and device performance according to the procedure described in Comparative Example 1. The data is summarized in Table I which shows that optical absorbance has increased to about 10× as compared with that of non-PSSNa containing PPy/poly(TFE-PSEPVE). The enhancement is sufficient to render the film laser-ablatable although voltage of device increases about 9%, efficiency decreases about 18%, and lifetime decreases about 27%. However the loss can be recovered by lowering pH of the dispersion as illustrated in Example 1B and 1C.

Example 1B

Addition with a Mixture of PSSNA and PSSA to Lower pH of the Aqueous PPy/Poly(TFE-PSEPVE) Dispersion and its Effect on Device Performance In this example, the aqueous PPy/Poly(TFE-PSEPVE) dispersion made in Comparative Example 1 was added with a mixture of PSSNa and PSSA in the oxygen free box. The PSSNa solution made in Example 1 was used. A PSSA solution was prepared by diluting 14.98 g PSSA solution (~30% w/w in water, Cat. #08770, PolySciences, Inc.) with 15.00 g deionized water in a glass vial. Actual % was determined to be 15.15% after degassed. The aqueous PSSA solution was also transferred to the oxygen free box for mixing with the PPy/poly(TFE-PSEPVE).

69.996 g PPy/poly(TFE-PSEPVE) was slowly added with 0.183 g PSSA solution followed with 4.581 g PSSNa solution in the oxygen free box. The weight of the three components was calculated to be 0.6 $PSS^-$ per one acid equivalent of poly(TFE-PSEPVE). The amount of PSSNa/PSSA constitutes 0.6% (w/w) of the final dispersion, which was measured to have pH of 3.10. pH of the PSSNa/PSSA containing PPy/poly(TFE-PSEPVE) is lower than that (pH 4.1) of the dispersion prior to the addition.

The PSSNa/PSSA containing PPy/poly(TFE-PSEPVE) dispersion was also measured for optical absorbance and device performance according to the procedure described in Comparative Example 1. The data is summarized in Table I which shows that optical absorbance has also increased to about 10× as compared with that of non-PSSNa/PSSA containing PPy/poly(TFE-PSEPVE). The device data also shows that voltage of device has decreased, and efficiency and lifetime has increased as compared with Example 1A. This example illustrates that loss of device performance can be recovered by lowering pH of the dispersion.

Example 1C

Addition with a Mixture of PSSNA and PSSA to Further Lower pH of the Aqueous PPy/Poly(TFE-PSEPVE) Dispersion and its Effect on Device Performance In this example, the aqueous PPy/Poly(TFE-PSEPVE) dispersion made in Comparative Example 1 was added with a mixture of PSSNa and PSSA in the oxygen free box. The PSSNa and PSSA solutions made in the two previous examples were used.

49.694 g PPy/poly(TFE-PSEPVE) was slowly added with 0.316 g PSSA solution followed with 3.037 g PSSNa solution in the oxygen free box. The weight of the three components was calculated to be 0.6 $PSS^-$ per one acid equivalent of poly(TFE-PSEPVE). The amount of PSSNa/PSSA constitutes 0.6% (w/w) of the final dispersion, which was measured to have pH of 2.8. pH of the PSSNa/PSSA containing PPy/poly(TFE-PSEPVE) is lower than that (pH3.1) of the dispersion of Example 1B.

The PSSNa/PSSA containing PPy/poly(TFE-PSEPVE) dispersion was also measured for optical absorbance and device performance according to the procedure described in Comparative Example 1. The data is summarized in Table I which shows that optical absorbance has also increased to about 10× as compared with that of non-PSSNa/PSSA containing PPy/poly(TFE-PSEPVE). The enhancement is sufficient to render the film laser-ablatable. The device data also shows that device performance is equivalent to that of non-PSSNa/PSSA containing PPy/poly(TFE-PSEPVE as illustrated in Comparative Example 1.

efficiency and voltage @2,000 nits ($cd/m^2$) and lifetime (T50) with four devices stressed at a constant current of 30 $mA/cm^2$ at room temperature.

Examples 2A, 2B and 2C

This set of examples illustrates effect of poly(styrenesulfonic acid) sodium salt, PSSNa, on device performance of pH 4.1 polypyrrole/poly(TFE-PSEPVE).

Example 2A

PSSNA at 0.6% (w/w) Concentration (Equivalent to 0.4 PSSNa Per One Acid Equivalent of Poly(TFE-PSEPVE)

In this example, the aqueous PPy/Poly(TFE-PSEPVE) dispersion made in Comparative Example 1 was added with PSSNa in the oxygen free box. The PSSNa solution made in Example 1 was used.

70.002 g PPy/poly(TFE-PSEPVE) was slowly added with 3.216 g PSSNa solution in the oxygen free box. The weight of the two components was calculated to be 0.4 $PSS^-$ per one acid equivalent of poly(TFE-PSEPVE). The amount of PSSNa constitutes 0.6% (w/w) of the final dispersion, which was measured to have pH of 4.10. pH of the PPy/poly(TFE-PSEPVE) was maintained by adding the PSSNa.

The PSSNa containing PPy/poly(TFE-PSEPVE) dispersion was also measured for optical absorbance and device performance according to the procedure described in Comparative Example 1. The data is summarized in Table I which shows that optical absorbance has also increased to about 5× as compared with that of non-PSSNa containing PPy/poly(TFE-PSEPVE). The enhancement renders the film laser-ablatable although voltage of device increases about 9%, and efficiency decreases about 21%, whereas lifetime remains the same. It should be pointed out, as illustrated in Examples 1B and 1C, the loss can be recovered by lowering pH to about 3 with addition of a mixture of PSSNa and PSSA instead of just PSSNa only.

TABLE I

Effect of additive (PSSNa or PSSNa/PSSA mixture) on optical absorbance, and device performance

| Sample | Additive %(w/w) | PSS-/ Poly(TFE/PSEPVE) | PH | Abs./100 nm | Voltage (volt) @2,000 nits | Efficiency (cd/A) @2,000 nits | T50 (hrs) @30 $mA/cm^2$ |
|---|---|---|---|---|---|---|---|
| Comp. Example 1 | 0 | 0 | 4.1 | 0.013 | 3.2 | 17.5 | 375 |
| Example 1A | 0.9 | 0.6 | 4.1 | 0.11 | 3.5 | 14.4 | 275 |
| Example 1B | 0.9 | 0.6 | 3.1 | 0.11 | 3.4 | 15.3 | 330 |
| Example 1C | 0.9 | 0.6 | 2.8 | 0.11 | 3.3 | 17.7 | 363 |

Comparative Example 2

This comparative example illustrates device performance of a high pH polypyrrole/poly(TFE-PSEPVE) dispersion for comparison with Examples 2A, 2B and 2C.

The aqueous PPy/Poly(TFE-PSEPVE) dispersion made in Comparative Example 1 has a pH of 4.1. Although this pH is still not considered the highest, higher pH or neutral can be made easily by additional treatment with a cationic resin or by adding a basic solution. For comparison purpose to see effect of addition of PSSNa, this pH suffices.

Devices were made and tested at the same time as those of Examples 2A, 2B, and 2C according to the procedure describe in Comparative Example 1. Table 2 shows device Example 2B PSSNA at 0.84% (w/w) Concentration (Equivalent to 0.55 PSSNa Per One Acid Equivalent of Poly(TFE-PSEPVE)

In this example, the aqueous PPy/Poly(TFE-PSEPVE) dispersion made in Comparative Example 1 was added with PSSNa in the oxygen free box. The PSSNa solution made in Example 1 was used.

70.004 g PPy/poly(TFE-PSEPVE) was slowly added with 4.40 g PSSNa solution in the oxygen free box. The weight of the two components was calculated to be 0.55 PSS⁻ per one acid equivalent of poly(TFE-PSEPVE). The amount of PSSNa constitutes 0.6% (w/w) of the final dispersion, which was measured to have pH of 4.10. pH of the PPy/poly(TFE-PSEPVE) was maintained by adding the PSSNa.

The PSSNa containing PPy/poly(TFE-PSEPVE) dispersion was only measured for device performance according to the procedure described in Comparative Example 1. Although optical absorbance was not measured, but one should expect about 0.11 per 100 nm thick film based on Examples 1A, 1B, and 1C. The absorbance enhancement should render the film laser-ablatable. Device data shows that voltage increases about 12%, efficiency decreases about 23%, and lifetime decreases about 16%. It should be pointed out again, as illustrated in Examples 1B and 1C, the loss can be recovered by lowering pH to about 3 with addition of a mixture of PSSNa and PSSA instead of just PSSNa only.

Example 2C

PSSNA at 1.04% (w/w) Concentration (Equivalent to 0.7 PSSNa Per One Acid Equivalent of Poly(TFE-PSEPVE)

In this example, the aqueous PPy/Poly(TFE-PSEPVE) dispersion made in Comparative Example 1 was added with PSSNa in the oxygen free box. The PSSNa solution made in Example 1 was used.

69.998 g PPy/poly(TFE-PSEPVE) was slowly added with 5.60 g PSSNa solution in the oxygen free box. The weight of the two components was calculated to be 0.7 PSS⁻ per one acid equivalent of poly(TFE-PSEPVE). The amount of PSSNa constitutes 1.04% (w/w) of the final dispersion, which was measured to have pH of 4.10. pH of the PPy/poly(TFE-PSEPVE) was maintained by adding the PSSNa.

The PSSNa containing PPy/poly(TFE-PSEPVE) dispersion was only measured for optical absorbance and device performance according to the procedure described in Comparative Example 1. Although optical absorbance was not measured, but one should expect that be greater than 0.11 per 100 nm thick film based on Examples 1A, 1B, and 1C. The optical absorbance enhancement should render the film laser-ablatable although voltage of device increases about 15%, efficiency decreases about 30%, and lifetime decreases about 48%. It should be pointed out that the loss has become very large and may be recovered by lowering pH with addition of a mixture of PSSNa and PSSA instead of just PSSNa only. This example also illustrates that the PSS⁻/poly(TFE-PSEPVE) equivalent ratio should be kept below 0.7.

Note that not all of the activities described above in the general description or the examples are required, that a portion of a specific activity may not be required, and that one or more further activities may be performed in addition to those described. Still further, the order in which activities are listed is not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

In some embodiments, the invention herein can be construed as excluding any element or process step that does not materially affect the basic and novel characteristics of the composition or process. Additionally, in some embodiments, the invention can be construed as excluding any element or process step not specified herein.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

TABLE 2

Effect of additive (PSSNa) on optical absorbance, and device performance

| Sample | Additive %(w/w) | PSS⁻/ Poly(TFE-PSEPVE) | PH | Abs./100 nm | Voltage @2,000 nits | Efficiency (Cd/A) @2,000 nits | T50 (hrs) @30 mA/cm² |
|---|---|---|---|---|---|---|---|
| Comp. Example 2 | 0 | 0 | 4.1 | 0.013 | 3.4 | 16.6 | 465 |
| Example 2A | 0.6 | 0.4 | 4.1 | 0.06 | 3.7 | 13.2 | 475 |
| Example 2B | 0.84 | 0.55 | 4.1 | — | 3.8 | 12.8 | 390 |
| Example 2C | 1.04 | 0.7 | 4.1 | — | 3.9 | 11.6 | 240 |

What is claimed is:

1. A film made from a aqueous dispersion comprising (a) at least one electrically conductive polymer doped with at least one highly-fluorinated acid polymer and (b) a second material selected from the group consisting of an acid salt of a second polymeric acid and a combination of an acid salt of the second polymeric acid and the second polymeric acid a second polymeric acid, an acid salt of the second polymeric acid, and combinations thereof, wherein the second polymeric acid is different from the highly-fluorinated acid polymer, and wherein a 100 nm thick film made from the aqueous dispersion has an optical absorbance which is at least 0.05 absorbance units greater than the absorbance of a 100 nm thick film made from the electrically conductive polymer without component (b), in at least one wavelength in the range of 200-350 nm.

2. The film of claim 1, wherein the electrically conductive polymer is selected from the group consisting of polythiophenes, poly(selenophenes), poly(tellurophenes), polypyrroles, poly(thienothiophenes), poly(thienoselenophenes), copolymers thereof, and combinations thereof.

3. The film of claim 2, wherein the electrically conductive polymer is selected from the group consisting of unsubstituted polyaniline, poly(3,4-ethylenedioxythiophene), unsubstituted polypyrrole, poly(thieno(2,3-b)thiophene), poly(thieno(3,2-b)thiophene), and poly(thieno(3,4-b)thiophene).

4. The film of claim 1, wherein the highly-fluorinated acid polymer is at least 95% fluorinated.

5. The film of claim 1, wherein the highly-fluorinated acid polymer is selected from a sulfonic acid and a sulfonimide.

6. The film of claim 1, wherein the highly-fluorinated acid polymer is a perfluoroolefin having perfluoro-ether-sulfonic acid side chains.

7. The film of claim 1, wherein the highly-fluorinated acid polymer is selected from the group consisting of a copolymer of 1,1-difluoroethylene and 2-(1,1-difluoro-2-(trifluoromethyl)allyloxy)-1,1,2,2-tetrafluoroethanesulfonic acid and a copolymer of ethylene and 2-(2-(1,2,2-trifluorovinyloxy)-1,1,2,3,3,3-hexafluoropropoxy)-1,1,2,2-tetrafluoroethanesulfonic acid.

8. The film of claim 1, wherein the highly-fluorinated acid polymer is selected from a copolymer of tetrafluoroethylene and perfluoro(3,6-dioxa-4-methyl-7-octenesulfonic acid), and a copolymer of tetrafluoroethylene and perfluoro(3-oxa-4-pentenesulfonic acid).

9. The film of claim 1, wherein second polymeric acid is less than 30% fluorinated.

10. The film of claim 1, wherein the second polymeric acid is non-fluorinated.

11. The film of claim 1, wherein the second polymeric acid is selected from a polymeric sulfonic acid and a polymeric sulfonimide.

12. The film of claim 1, wherein the acid equivalent ratio of the second material to the highly-fluorinated acid polymer is no greater than 1.0.

13. The film of claim 12, wherein the ratio is no greater than 0.7.

14. The film of claim 1, wherein the ratio of the second polymeric acid and anions of the second polymeric acid salt to the highly fluorinated acid polymer is in the range of 0.1 to 0.6.

15. An electronic device comprising at least one layer made from the film of claim 1.

16. The device of claim 15, wherein the layer is a buffer layer.

17. The device of claim 16, comprising an anode, a buffer layer, an electroactive layer, and a cathode.

* * * * *